(12) United States Patent
Shoji et al.

(10) Patent No.: US 7,302,236 B2
(45) Date of Patent: Nov. 27, 2007

(54) RADIO COMMUNICATION METHOD AND SYSTEM FOR PERFORMING COMMUNICATION AMONG A PLURALITY OF RADIO COMMUNICATION TERMINALS

(75) Inventors: Yozo Shoji, Tokyo (JP); Kiyoshi Hamaguchi, Tokyo (JP); Hiroyo Ogawa, Tokyo (JP)

(73) Assignee: National Institute of Information and Communications Technology, Tokyo (JP)

( * ) Notice: Subject to any disclaimer, the term of this patent is extended or adjusted under 35 U.S.C. 154(b) by 9 days.

(21) Appl. No.: 10/504,059

(22) PCT Filed: Jan. 9, 2003

(86) PCT No.: PCT/JP03/00114

§ 371 (c)(1),
(2), (4) Date: Apr. 19, 2005

(87) PCT Pub. No.: WO03/069792

PCT Pub. Date: Aug. 21, 2003

(65) Prior Publication Data

US 2005/0176377 A1 Aug. 11, 2005

(30) Foreign Application Priority Data

Feb. 18, 2002 (JP) ............................. 2002-039591

(51) Int. Cl.
*H04B 1/00* (2006.01)
*H04B 7/00* (2006.01)

(52) U.S. Cl. .................. 455/68; 455/41.2; 455/255; 455/265; 370/338

(58) Field of Classification Search ................. 455/42, 455/68, 500, 41.2, 41.3, 255–259, 265–266; 370/338
See application file for complete search history.

(56) References Cited

U.S. PATENT DOCUMENTS 3,931,575 A * 1/1976 Amoroso, Jr. ............... 455/75

5,355,523 A * 10/1994 Ogawa et al. ............... 455/71
6,184,920 B1 2/2001 Masuda et al.
2003/0050083 A1 * 3/2003 Metais et al. ............... 455/509

FOREIGN PATENT DOCUMENTS

| EP | 0 386 874 | * | 1/1990 |
| EP | 0 386 874 A2 | | 9/1990 |
| JP | 05-048491 | | 2/1993 |
| JP | 05-063679 | | 3/1993 |
| JP | 05-068018 | | 3/1993 |
| JP | 05-206886 | | 8/1993 |
| JP | 2001-53640 | | 2/2001 |
| JP | 2002-9655 | | 1/2002 |

* cited by examiner

*Primary Examiner*—Nay Maung
*Assistant Examiner*—Tuan H. Nguyen
(74) *Attorney, Agent, or Firm*—Staas & Halsey LLP

(57) ABSTRACT

A reference local oscillation signal transmission station 1 radiates a reference local oscillation signal to a service zone. A portion of the signal received by each radio slave station terminal 2 is branched and fed to an injection locked oscillator 6. As a result, a local oscillation signal which is synchronized with the reference local oscillation signal is obtained. In the slave station terminal 2, the thus-obtained local oscillation signal is fed to a transmission frequency converter (mixer) 7 and a reception frequency converter (mixer) 8. An IF band transmission modulated signal is fed to the mixer 7 for frequency conversion to a radio frequency band, and the thus-obtained radio-frequency modulated signal is transmitted. Meanwhile, a received radio-frequency modulated signal is fed to the mixer 8 for down conversion, and the thus-obtained signal is fed to an IF band demodulator 10 so as to restore an information signal. The present invention not only solves the problem of deterioration of signal quality stemming from phase noise and frequency offset generated in a millimeter wave band oscillator, but also improves the efficiency of frequency use.

2 Claims, 7 Drawing Sheets

TRANSMITTER

RECEIVER

PRIOR ART

RADIO COMMUNICATION METHOD AND SYSTEM FOR PERFORMING COMMUNICATION AMONG A PLURALITY OF RADIO COMMUNICATION TERMINALS

TECHNICAL FIELD

The present invention relates to a radio communication method and system for communications between a plurality of radio communication terminals.

BACKGROUND ART

A radio communication apparatus for transmitting a high-speed digital signal or a broadband analog signal generally consists of a transmitter in which a product of an intermediate-frequency-band modulated signal (IF) and a local oscillation signal (LO) is obtained for up conversion, and a thus-generated radio-frequency modulated signal (RF) is transmitted; and a receiver in which a product of an RF and an LO is obtained for down conversion, whereby an IF is produced. In such a case, in order to maintain the quality of a transmitted signal, the IF input to the transmitter and the IF generated in the receiver must have a known constant frequency difference therebetween, and variation in the phase difference with time must be small. Therefore, local oscillators for generating the LOs in the transmitter and the receiver must be high in frequency stability and low in phase noise. In particular, in a microwave or millimeter wave band in which radio waves are of high frequency, stable, low-noise local oscillators are realized by making use of a dielectric resonator or a PLL (Phase Lock Loop) circuit.

However, with an increase in the frequency to be used (e.g., in a millimeter wave band of 30 GHz or higher), the stable, low-noise oscillators become difficult to realize, and their production cost increases. For example, in the case of a dielectric resonator, its Q value (Quality Factor) decreases and fails to exhibit a desired performance. In the case of a PLL circuit, the configuration of a frequency divider becomes particularly difficult. In another method, a signal from a low-frequency oscillator is frequency-multiplied so as to obtain an LO. However, this method generally requires an amplifier for increasing the signal strength, which raises various problems, including increases in cost, size, and consumption of electrical power.

In order to solve these problems, Japanese Patent Application Laid-Open (kokai) NO. 2001-53640 has proposed a radio communication apparatus and a radio communication method as shown in FIGS. 7(A) and 7(B). In a transmitter of this example, an intermediate-frequency-band modulated signal IF, which is obtained through modulation of an input signal, is mixed, by means of a mixer 83, with a local oscillation signal LO from a local oscillator 85 so as to obtain a product therebetween, whereby a radio-frequency modulated signal RF is generated. The RF is passed through a filter 86 for removal of unnecessary components and is then fed to a power mixer 87, at which a portion of the LO is added to the RF. After the RF is amplified by means of an amplifier 88 so as to increase its signal level, the RF is transmitted from an antenna as a radio signal. Meanwhile, in a receiver, a radio signal received by an antenna is amplified by means of an amplifier 91 so as to increase its signal level, and is then passed through a filter 92. Subsequently, the RF is demodulated to an IF by means of a square-law detector 93. In this method, the same LO as that used for generation of the RF signal is transmitted as a radio signal. Therefore, this method is advantageous in that influences of phase noise of the local oscillator 85 serving as an LO source are cancelled out at the time of demodulation and that the IF obtained through demodulation has the same frequency as that of the original IF input to the transmitter.

The above-described technique is applicable only to an apparatus and method for one-way radio communications. In actual communications, two-way radio communications are necessary. A configuration for such a case has been proposed by the present inventors in connection with the "Two-Way Radio Communication System and Two-Way Radio Communication Method" described in Japanese Patent Application Laid-Open (kokai) NO. 2002-9655.

DISCLOSURE OF THE INVENTION

However, several problems arise in a radio communication system configured for N to N communications among N terminals. That is, although the above-mentioned two-way radio communication system and method are effective for two-way (bi-directional) communications between two terminals, when the number of terminals increased to N, difficulty is encountered in configuring a radio communication system which solves a problematic signal deterioration caused by an employed local oscillation signal and which effectively uses a frequency.

The present invention has been accomplished in view of the foregoing problems. A radio communication system according to the present invention is adapted for communications between a plurality of radio communication terminals and is configured in such a manner that each of the plurality of radio communication terminals has a transmission section in which a product of an intermediate-frequency-band modulated signal and a local oscillation signal is obtained so as to generate a radio-frequency modulated signal; and a reception section in which a product of the radio-frequency modulated signal and the local oscillation signal is obtained for down conversion to an intermediate-frequency-band modulated signal. Separately from the above-mentioned terminals, a transmission station for transmitting only a reference local oscillation signal is provided. Each of the radio communication terminals receives the reference local oscillation signal. After amplification and band-pass filtering, the received reference local oscillation signal is fed to an injection locked oscillator so as to reproduce the local oscillation signal synchronized with the reference local oscillation signal of a proper level. The thus-reproduced signal is used as a local oscillation signal for frequency conversion in the transmission section and the reception section. This configuration enables all the terminals within the network to generate and receive millimeter wave signals which are synchronized in frequency and phase. Further, even in the case where the reference local oscillation signal is produced by inexpensive means and has large phase noise and frequency offset, their influences are cancelled out as a result of transmission and reception between terminals, whereby high-quality signal transmission becomes possible.

Alternatively, in the present invention, one of the terminals serves as a master station; a local oscillation signal used in the master station is transmitted to the air as a reference local oscillation signal; and each of the remaining radio communication terminals receives the reference local oscillation signal. After amplification and band-pass filtering, the received reference local oscillation signal is fed to an injection locked oscillator so as to reproduce the local oscillation signal synchronously with the reference local oscillation signal of a proper level. The thus-reproduced signal is used as a local oscillation signal for frequency conversion in the transmission section and the reception section. This configuration enables all the terminals within the network to generate and receive millimeter wave signals which are synchronized in frequency and phase. Further, even in the case where the reference local oscillation signal is produced by inexpensive means and has large phase noise and frequency offset, their influences are cancelled out as a result of transmission and reception between terminals, whereby high-quality signal transmission becomes possible.

Moreover, in the present invention, each of the radio communication terminals is configured to serve as a base station or a master station. Therefore, without provision of a special reference signal transmission station or base station, a network which enables high-quality communications can be produced instantly at any location.

BEST MODE FOR CARRYING OUT THE INVENTION

First Embodiment

Figure 1:
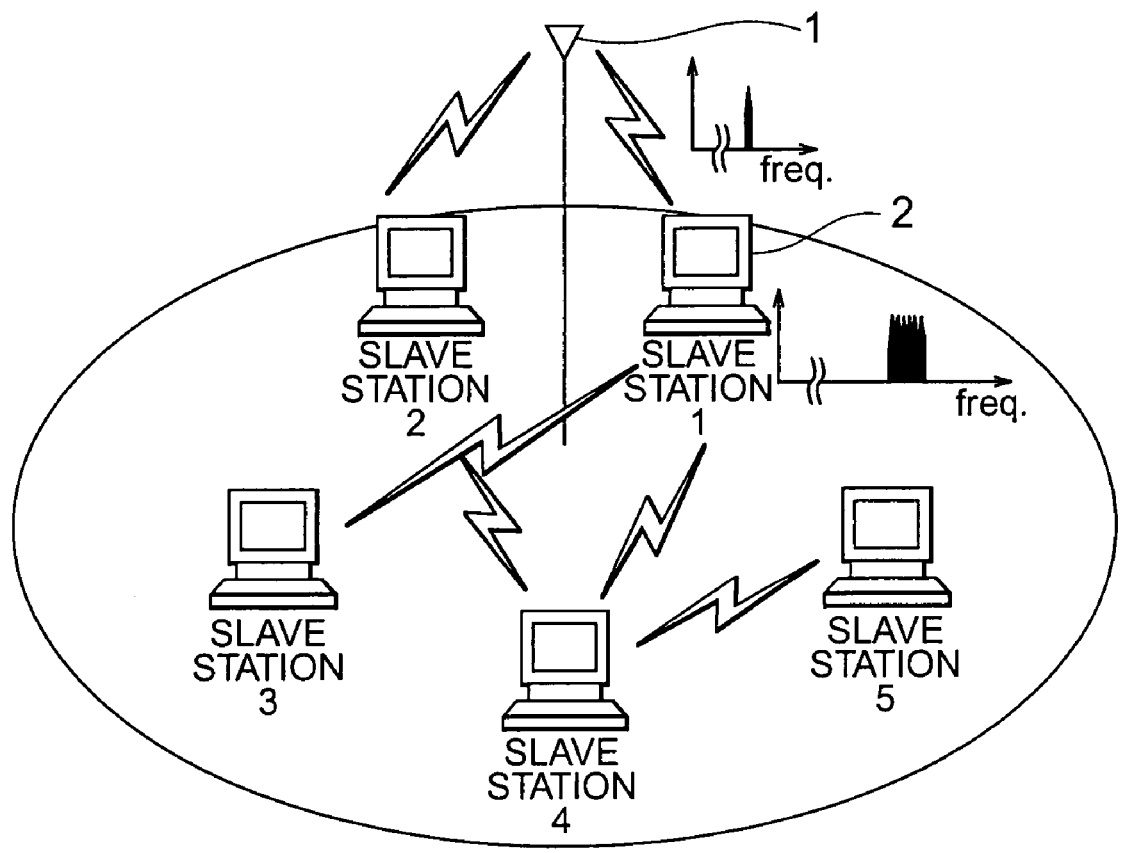
FIG. 1 shows the configuration of a radio communication system according to a first embodiment of the present invention, along with the transmission signal spectrum of each station.
Figure 2A:
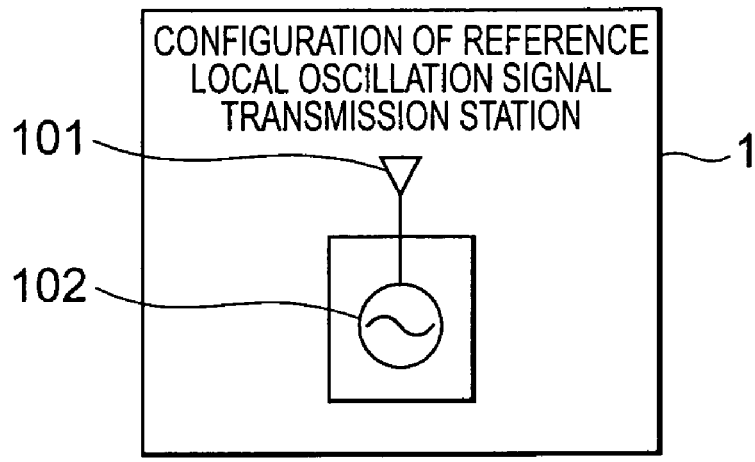
FIGS. 2(A) and 2(B) respectively show the specific configurations of a reference local oscillation signal transmission station and a slave station of the radio communication system exemplified in FIG. 1.
Figure 2B:
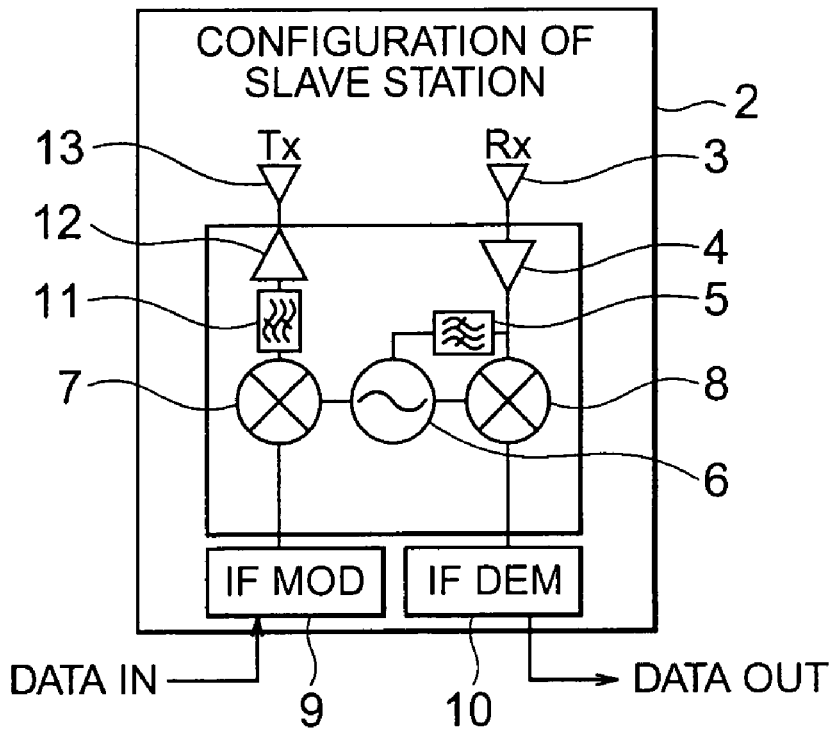

FIG. 1 shows the configuration of a radio communication system according to a first embodiment of the present invention, along with transmission signal spectrum of each station. FIGS. 2(A) and 2(B) respectively show the specific configurations of a reference local oscillation signal transmission station and a slave station of the radio communication system of the first embodiment. A reference local oscillation signal transmission station 1 radiates a reference local oscillation signal generated at a reference local oscillator 102 to a service zone via a transmission antenna 101. Each radio slave station terminal 2 (slave station No. 1, slave station No. 2, slave station No. 3, etc.) receives the reference local oscillation signal via an antenna 3. The received reference local oscillation signal is amplified by means of an amplifier 4, and a portion of the amplified reference local oscillation signal is passed through a band-pass filter 5 for removal of unnecessary waves and is fed to an injection locked oscillator 6. As a result, the injection locked oscillator 6 produces a local oscillation signal which is synchronized with the reference local oscillation signal transmitted from the reference local oscillation signal transmission station 1. In the slave station terminal 2, the thus-obtained local oscillation signal is fed to a transmission frequency converter (mixer) 7 and a reception frequency converter (mixer) 8. The mixers 7 and 8 in the slave station terminal 2 are connected to a generator 9 for generating an intermediate-frequency (IF) band modulated signal and to a demodulator 10, respectively. The IF band modulated signal, which is the output of the generator 9 to be transmitted, is fed to the mixer 7 for frequency conversion to a radio frequency band, whereby a radio-frequency modulated signal is obtained. After removal of unnecessary waves by means of a band-pass filter 11, the radio-frequency modulated signal is amplified by means of an amplifier 12, and is transmitted from a transmission antenna 13. Meanwhile, a radio-frequency modulated signal received by the reception antenna 3 is amplified by means of the amplifier 4, and then fed via a branch point to the mixer 8 for down conversion. The thus-obtained signal is fed to the IF band demodulator 10 so as to restore an information signal.

In the first embodiment, a station for transmitting only a reference local oscillation signal is provided separately from the slave station terminals. In the case of a system having a restricted transmission antenna power per transmission station, a greater amount of transmission power can be allocated to the reference local oscillation signal as compared with the case of a second or third embodiment which will be described below, whereby the communication area can be expanded.

Second Embodiment

Figure 3:
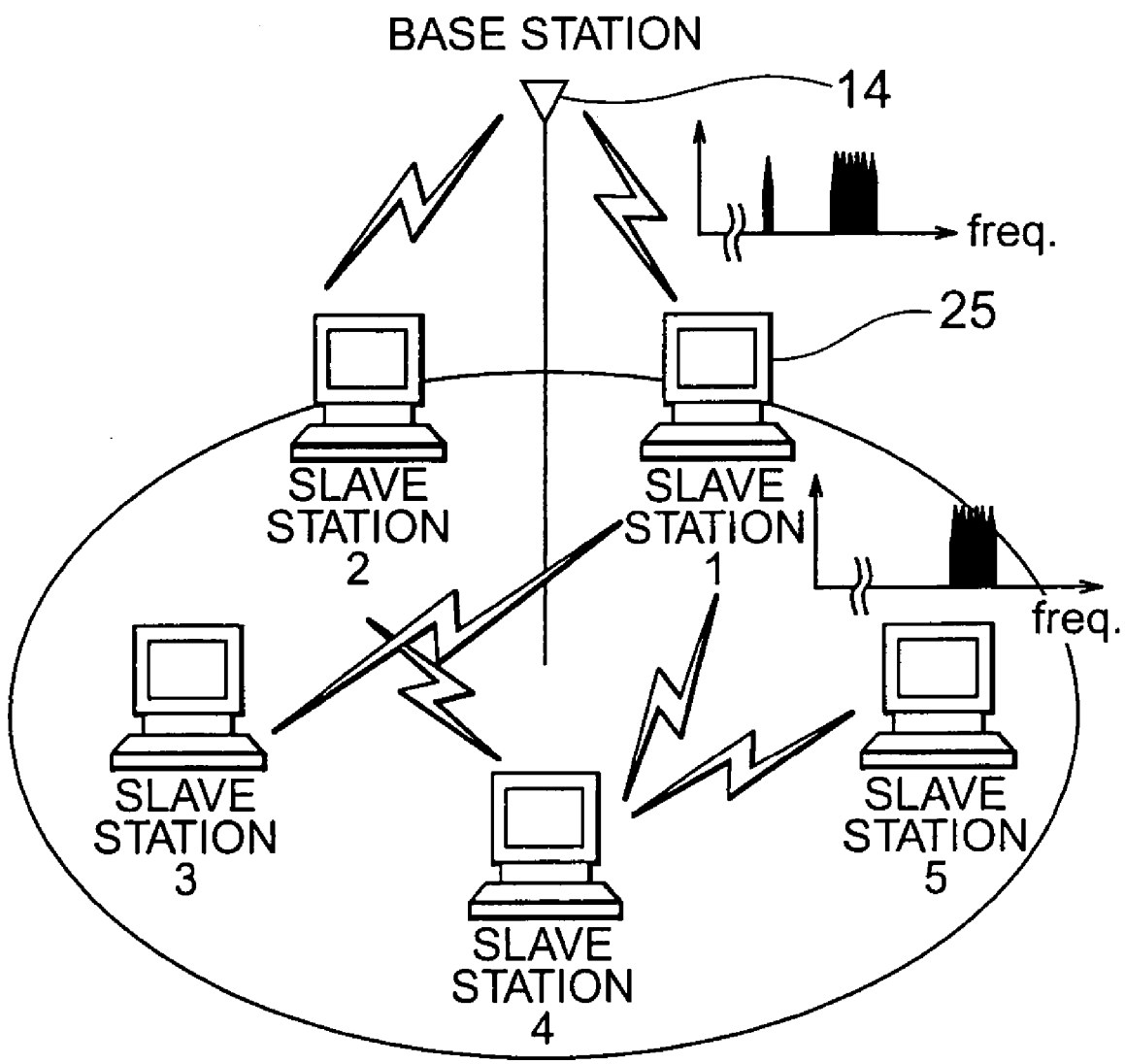
FIG. 3 shows the configuration of a radio communication system according to a second embodiment of the present invention, along with the transmission signal spectrum of each station.
Figure 4A:
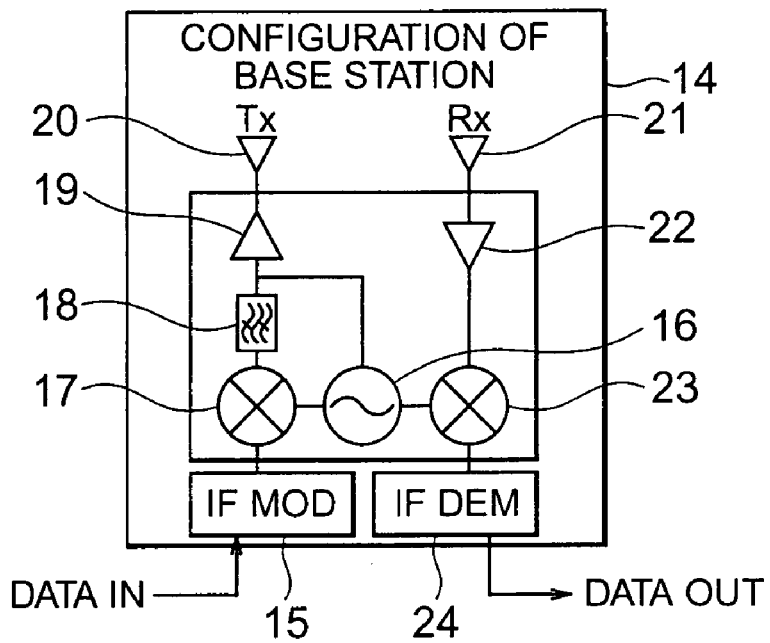
FIGS. 4(A) and 4(B) respectively show the specific configurations of a base station and a slave station of the radio communication system exemplified in FIG. 3.
Figure 4B:
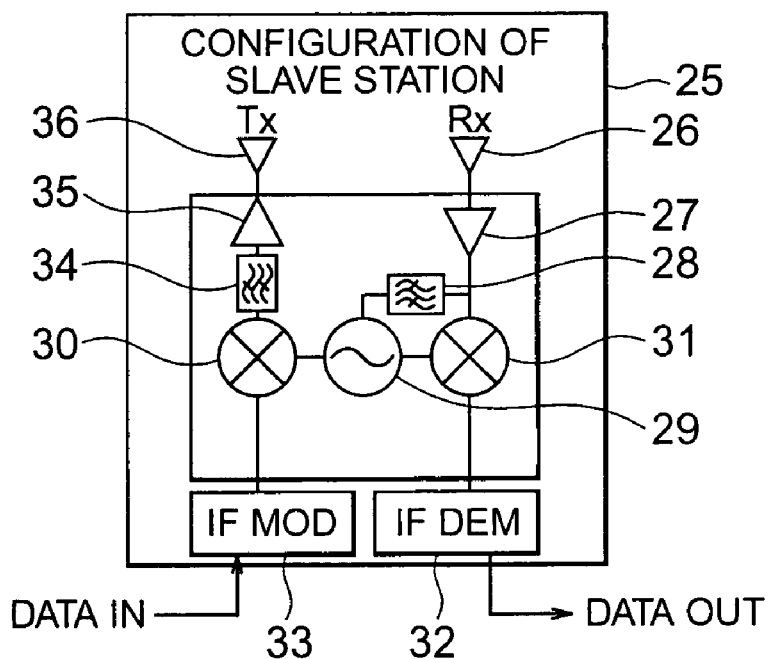

FIG. 3 shows the configuration of a radio communication system according to the second embodiment of the present invention, along with the transmission signal spectrum of each station. FIGS. 4(A) and 4(B) respectively show the specific configurations of a base station and a slave station of the radio communication system of the second embodiment. In a base station 14, an IF band modulated signal received from an IF band modulated signal generator 15 is fed to a mixer 17, to which a signal from a local oscillator 16 is supplied. Thus, the IF band modulated signal is converted to a signal in the radio frequency band. The thus-obtained radio signal is passed through a band-pass filter 18 so as to remove unnecessary wave components therefrom. A portion of a local oscillation signal, which serves as a reference local oscillation signal within the network, is added to the radio signal. A resultant radio signal is amplified by means of an amplifier 19 and is then transmitted from an antenna 20. Further, a radio signal transmitted from a slave satiation terminal to the base station 14 is received by an antenna 21, and is then amplified by means of an amplifier 22. The amplified radio signal is fed to a mixer 23, to which a signal from the local oscillator 16 is supplied. Thus, the radio signal is frequency-converted to an IF band, and a resultant IF band modulated signal is fed to an IF band demodulator 24, whereby an information signal is restored.

Meanwhile, in a slave station terminal 25, a reference local oscillation signal transmitted from the base station 14 and received by a reception antenna 26 is amplified by means of an amplifier 27. A portion of the amplified reference local oscillation signal is branched and passed through a band-pass filter 28 for removal of unnecessary waves, and is fed to an injection locked oscillator 29. As a result, the injection locked oscillator 29 produces a local oscillation signal which is synchronized with the reference local oscillation signal transmitted from the base station 14. The thus-obtained local oscillation signal is fed to a transmission mixer 30 and a reception mixer 31. A radio-frequency modulated signal which the slave station terminal 25 receives by means of the reception antenna 26 is amplified by means of the amplifier 27, and then fed via a branch point to the reception mixer 31, whereby the radio-frequency modulated signal is converted to an IF band modulated signal. The thus-obtained IF band modulated signal is fed to an IF band demodulator 32 so as to restore an information signal. Transmission of a signal from the slave station terminal 25 is performed as follows. First, an IF band modulated signal, which is obtained from an IF band modulated signal generator 33 is fed to the transmission mixer 30 for frequency conversion to a radio frequency band, whereby a radio-frequency modulated signal is obtained. After removal of unnecessary waves by means of a band-pass filter 34, the radio-frequency modulated signal is amplified by means of an amplifier 35, and is transmitted from a transmission antenna 36.

Third Embodiment

Figure 5:
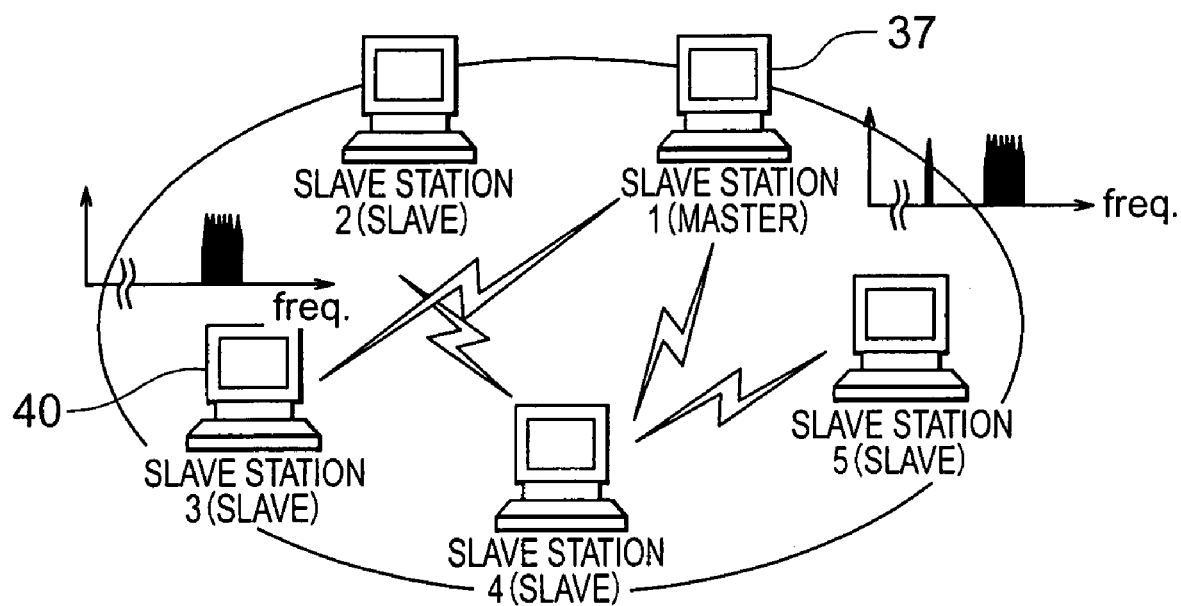
FIG. 5 shows the configuration of a radio communication system according to a third embodiment of the present invention, along with the transmission signal spectrum of each station.
Figure 6A:
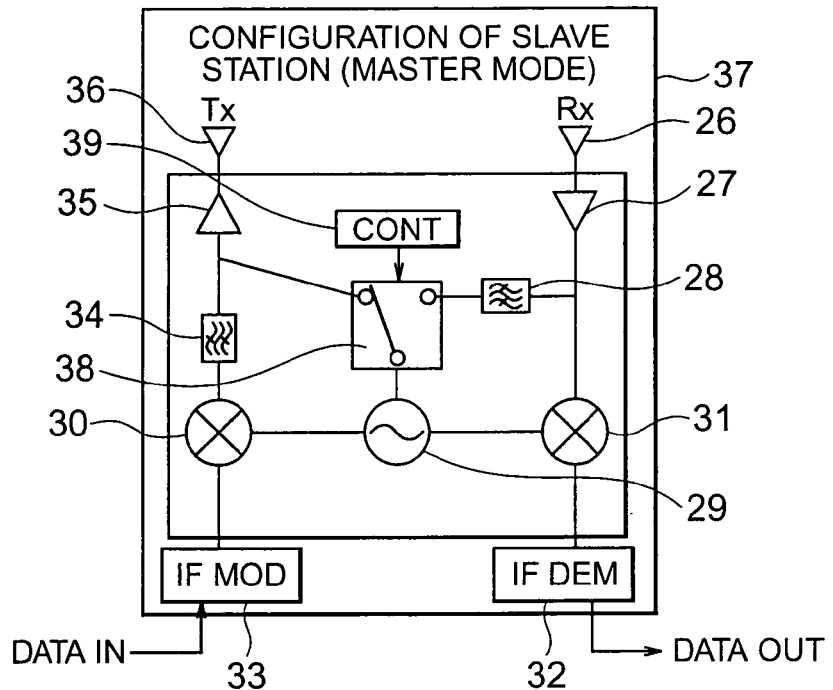
FIGS. 6(A) and 6(B) respectively show the specific configurations of a slave station (master mode) and a slave station (slave mode) of the radio communication system exemplified in FIG. 5.
Figure 6B:
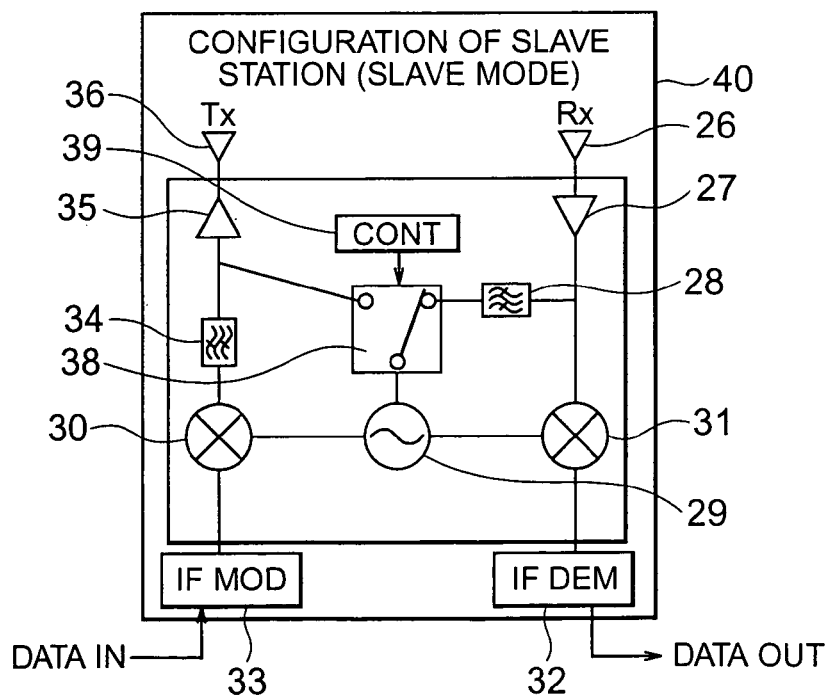
Figure 7A:
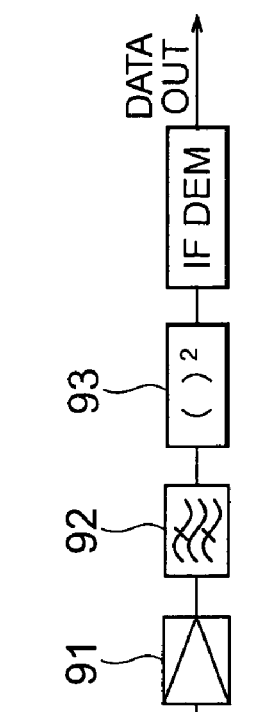
FIGS. 7(A) and 7(B) are diagrams showing a conventional technique.
Figure 7B:
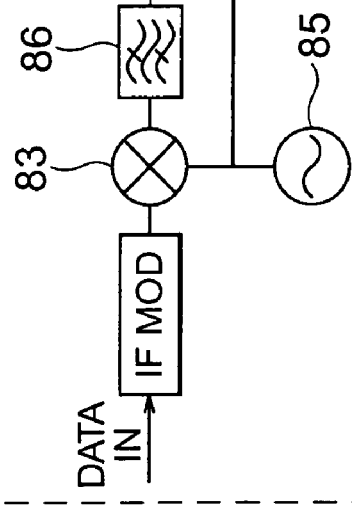

FIG. 5 shows the configuration of a radio communication system according to a third embodiment of the present invention, along with the transmission signal spectrum of each station. FIGS. 6(A) and 6(B) respectively show the specific configurations of a slave station (master mode) and a slave station (slave mode) of the radio communication system of the third embodiment. The present radio communication system consists of a plurality of slave station terminals (slave station No. 1, slave station No. 2, slave station No. 3, etc.). However, each of the terminals is designed in such a manner that it can selectively assume either of two states; i.e., a master mode and a slave mode, and that, in a single network, only one slave station can operate in the master mode, that slave station being determined by a protocol of an upper layer with resect to the physical layer. In a slave station 37 having entered the master mode, a switch 38 is switched to a master mode side by means of a switch control section 39. As a result, an IF band modulated signal received from an IF band modulated signal generator 33 is fed to a transmission mixer 30, to which a free-run signal from an injection locked oscillator 29 is supplied. Thus, the IF band modulated signal is converted to a signal in the radio frequency band. The thus-obtained radio signal is passed through a band-pass filter 34 so as to remove unnecessary wave components therefrom. A portion of the above-mentioned free-run local oscillation signal, which serves as a reference local oscillation signal within the network, is added to the radio signal. A resultant signal radio signal is amplified by means of an amplifier 35 and is then transmitted from an antenna 36. Further, a radio signal which the slave station in the maser mode receives from another slave station terminal in the slave mode is received by an antenna 26, and is then amplified by means of an amplifier 27. The amplified radio signal is fed to a reception mixer 31, to which a signal from the injection locked oscillator 29 is supplied. Thus, the radio signal is frequency-converted to an IF band, and a resultant IF band modulated signal is fed to an IF band demodulator 32, whereby an information signal is restored.

Meanwhile, in a slave station terminal 40 in the slave mode, the switch 38 is switched to a slave mode side by means of the switch control section 39. A reference local oscillation signal transmitted from the master-mode terminal 37 and received by the reception antenna 26 is amplified by means of the amplifier 27. A portion of the amplified reference local oscillation signal is branched and passed through a band-pass filter 28 for removal of unnecessary waves, and is fed to the injection locked oscillator 29. As a result, the injection locked oscillator 29 produces a local oscillation signal which is synchronized with the reference local oscillation signal transmitted from the slave station in the master mode. The thus-obtained local oscillation signal is fed to the transmission mixer 30 and the reception mixer 31. A radio-frequency modulated signal which the slave station terminal in the slave mode receives by means of the reception antenna 26 is amplified by means of the amplifier 27, and then fed via a branch point to the reception mixer 31, whereby the radio-frequency modulated signal is converted to an IF band modulated signal. The thus-obtained IF band modulated signal is fed to the IF band demodulator 32 so as to restore an information signal. Transmission of a signal from the slave station terminal is performed as follows. First, an IF band modulated signal, which is obtained from the IF band modulated signal generator 33, is fed to the transmission mixer 30, whereby a radio-frequency modulated signal is obtained. After removal of unnecessary waves by means of the band-pass filter 34, the radio-frequency modulated signal is amplified by means of the amplifier 35, and is transmitted from the transmission antenna 36.

In the third embodiment, since the base station (master station) and the slave stations are not required to have different configurations, a network can be formed at any location.

INDUSTRIAL APPLICABILITY

The present invention enables realization of a radio communication system for N to N communications among N terminals, which system solves the problem of signal deterioration caused by an employed local oscillation signal and effectively uses frequency.

The present invention enables all the terminals within the network to generate and receive millimeter wave signals which are synchronized in frequency and phase. At the same time, even in the case where a reference local oscillation signal is generated by inexpensive means, and has large phase noise and frequency offset, their influences are cancelled out as a result of transmission and reception between terminals, whereby high-quality signal transmission becomes possible.

Moreover, in the present invention, each of the radio communication terminals is configured to serve as a base station or a master station. Therefore, a network which enables high-quality communications can be produced instantly at any location.

The invention claimed is:

1. A radio communication method for communications between a plurality of radio communication terminals, wherein each of the plurality of radio communication terminals has a transmission section in which a product of an intermediate-frequency-band modulated signal and a local oscillation signal is obtained so as to generate a radio-frequency modulated signal, and a reception section in which a product of the radio-frequency modulated signal and a local oscillation signal is obtained for down conversion to an intermediate-frequency-band modulated signal, the method being characterized in that each of the plurality of radio communication terminals has an injection locked oscillator whose state is switched to either of a master mode and a slave mode by means of a switch;

a selected one of the plurality of radio communication terminals which serves as a base station or master station is switched to the master mode by controlling the switch, so that the selected radio communication terminal uses, as a local oscillation signal, a free-run signal from the injection locked oscillator, and transmits, along with a radio-frequency modulated signal, the free-run signal as a reference local oscillation signal; and each of the remaining radio communication terminals, which serve as slave stations, is switched to the slave mode by controlling the switch, so that each of the remaining radio communication terminals receives and amplifies the reference local oscillation signal transmitted from the base station or the master station, passes the amplified reference local oscillation signal through a band-pass filter, feeds the filtered reference local oscillation signal to the injection locked oscillator so as to reproduce the reference local oscillation signal, and uses the reference local oscillation signal as the local oscillation signals in frequency conversion sections of the transmission section and the reception section.

2. A radio communication system for communications between a plurality of radio communication terminals, wherein each of the plurality of radio communication terminals has a transmission section in which a product of an intermediate frequency-band modulated signal and a local oscillation signal is obtained so as to generate a radio-frequency modulated signal, and a reception section in which a product of the radio-frequency modulated signal and a local oscillation signal is obtained for down conversion to an intermediate-frequency-band modulated signal, the system being characterized in that each of the plurality of radio communication terminals has an injection locked oscillator whose state is switched to either of a master mode and a slave mode by means of a switch;

a selected one of the plurality of radio communication terminals which serves as a base station or master station is switched to the master mode by controlling the switch, so that the selected radio communication terminal uses, as a local oscillation signal, a free-run signal from the injection locked oscillator, and transmits, along with a radio-frequency modulated signal, the free-run signal as a reference local oscillation signal; and each of the remaining radio communication terminals, which serve as slave stations, is switched to the slave mode by controlling the switch, so that each of the remaining radio communication terminals receives and amplifies the reference local oscillation signal transmitted from the base station or the master station, passes the amplified reference local oscillation signal through a band-pass filter, feeds the filtered reference local oscillation signal to the injection locked oscillator so as to reproduce the reference local oscillation signal, and uses the reference local oscillation signal as the local oscillation signals in frequency conversion sections of the transmission section and the reception section.

* * * * *